United States Patent
Hsu et al.

(10) Patent No.: US 8,492,259 B2
(45) Date of Patent: Jul. 23, 2013

(54) METHOD OF FORMING METAL GATE STRUCTURE

(75) Inventors: Che-Hua Hsu, Hsinchu (TW); Shao-Hua Hsu, Taoyuan (TW); Zhi-Cheng Lee, Tainan (TW); Cheng-Guo Chen, Changhua (TW)

(73) Assignee: United Microelectronics Corp., Hsinchu (TW)

( * ) Notice: Subject to any disclaimer, the term of this patent is extended or adjusted under 35 U.S.C. 154(b) by 4 days.

(21) Appl. No.: 13/586,874

(22) Filed: Aug. 16, 2012

(65) Prior Publication Data
US 2012/0309185 A1 Dec. 6, 2012

Related U.S. Application Data

(63) Continuation of application No. 12/788,408, filed on May 27, 2010, now Pat. No. 8,268,712.

(51) Int. Cl.
*H01L 21/336* (2006.01)
*H01L 21/308* (2006.01)
*H01L 21/475* (2006.01)

(52) U.S. Cl.
USPC .... 438/592; 438/300; 438/736; 257/E21.035; 257/E21.177; 257/E21.2; 257/E21.232; 257/E21.258; 257/E21.267; 257/E21.431

(58) Field of Classification Search
USPC .......................................... 438/592; 257/412
See application file for complete search history.

(56) References Cited

U.S. PATENT DOCUMENTS

| | | | |
|---|---|---|---|
| 4,971,655 A * | 11/1990 | Stefano et al. | 438/592 |
| 5,441,914 A * | 8/1995 | Taft et al. | 438/592 |
| 6,174,818 B1 * | 1/2001 | Tao et al. | 438/733 |
| 6,191,016 B1 * | 2/2001 | Chau et al. | 438/585 |
| 6,309,926 B1 | 10/2001 | Bell et al. | |
| 6,869,868 B2 * | 3/2005 | Chiu et al. | 438/592 |
| 7,435,652 B1 | 10/2008 | Chen et al. | |
| 7,816,243 B2 | 10/2010 | Chuang et al. | |
| 8,044,469 B2 * | 10/2011 | Park et al. | 257/412 |
| 2006/0094235 A1 * | 5/2006 | Lee et al. | 438/736 |

(Continued)

FOREIGN PATENT DOCUMENTS

| | | |
|---|---|---|
| TW | 541613 B | 7/2003 |
| TW | 200603343 A | 1/2006 |
| TW | 200711134 A | 3/2007 |

OTHER PUBLICATIONS

UMCD-2009-0111 Trade Secret IDS.

*Primary Examiner* — Zandra Smith
*Assistant Examiner* — Toniae Thomas
(74) *Attorney, Agent, or Firm* — WPAT, PC; Justin King

(57) ABSTRACT

A method of forming metal gate structure includes providing a substrate; forming a gate dielectric layer, a material layer and a polysilicon layer stacked on the substrate; forming a first mask layer, a second mask layer and a patterned photoresist on the polysilicon layer; removing portions of the second mask layer and the first mask layer to form a hard mask by utilizing the patterned photoresist as an etching mask; removing the patterned photoresist, and next utilizing the hard mask as an etching mask to remove parts of the polysilicon layer and parts of the material layer. Thus, a gate stack is formed. Since the patterned photoresist is removed before forming the gate stack, the gate stack is protected from damages of the photoresist-removing process. The photoresist-removing process does not attack the sidewalls of the gate stack, so a bird's beak effect of the gate dielectric layer is prevent.

18 Claims, 16 Drawing Sheets

U.S. PATENT DOCUMENTS

| | | |
|---|---|---|
| 2006/0157796 A1* | 7/2006 | Kim et al. .................... 438/592 |
| 2007/0138563 A1 | 6/2007 | Callegari et al. |
| 2007/0178634 A1 | 8/2007 | Jung et al. |
| 2009/0042402 A1 | 2/2009 | Morioka |
| 2009/0309165 A1* | 12/2009 | Ogawa et al. ................ 438/592 |

* cited by examiner

METHOD OF FORMING METAL GATE STRUCTURE

CROSS-REFERENCE TO RELATED APPLICATION

This is a continuation application of an application Ser. No. 12/788,408, now U.S. Pat. No. 8,264,712, filed May 27, 2010. The entirety of the above-mentioned patent are hereby incorporated by reference herein and made a part of this specification.

FIELD OF THE INVENTION

The present invention relates to a method of forming a metal gate structure and a method of forming a metal gate transistor, and especially to a method of forming a metal gate structure of a metal oxide semiconductor (MOS) transistor.

BACKGROUND OF THE INVENTION

In the field of semiconductor fabrication, the use of poly-silicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having higher resistance, which causes the polysilicon gate to work under a much lower rate than the metal gates. On the other hand, the conventional polysilicon gate also has faced problems such as unavoidable depletion effect which increases equivalent thickness of the gate dielectric layer, reduces gate capacitance, and worsens a driving force of the devices. Thus, work function metals are developed to replace the conventional polysilicon gate to be the control electrode.

With a trend towards scaling down the MOS size, conventional methods, which are used to achieve optimization, such as reducing thickness of the gate dielectric layer, for example the thickness of silicon dioxide layer, have faced problems such as leakage current due to tunneling effect. In order to keep progression to next generation, high-k materials are used to replace the conventional silicon oxide to be the gate dielectric layer because it decreases physical limit thickness effectively, reduces leakage current, obtains equivalent capacitor in an identical equivalent oxide thickness (EOT), and can be competent to the work function metals.

Materials of the work function metal gates should well operate in both an N-type metal oxide semiconductor (NMOS) device and a P-type metal oxide semiconductor (PMOS) device. Accordingly, compatibility and process control for the metal gate are more complicated, meanwhile thickness and composition controls for materials used in the metal gate method have to be more precise. It is still a challenge to form an optimized work function metal gate to improve the performance of MOS transistors.

SUMMARY OF THE INVENTION

The present invention provides a method of forming a metal gate structure, so the gate stack and the gate dielectric layer are protected from damages of the photoresist-removing process, and a bird's beak effect of the gate dielectric layer is prevent.

The present invention provides a method of forming a metal gate structure is disclosed. First, a substrate is provided. Subsequently, a gate dielectric layer, a material layer and a poly-silicon layer are formed and stacked on the substrate. Next, a first mask layer is formed on the poly-silicon layer and a second mask layer is formed on the first mask layer. Next, a patterned photoresist is formed on the second mask layer. Next, portions of the second mask layer and portions of the first mask layer are removed to form a hard mask by utilizing the patterned photoresist as an etching mask. Furthermore, the patterned photoresist is removed. Following that, portions of the poly-silicon layer and portions of the material layer are removed to form a gate stack by utilizing the hard mask as an etching mask after removing the patterned photoresist.

The present invention provides a method of forming a metal gate structure is disclosed. First, a substrate is provided. Subsequently, a gate dielectric layer, a metal compound layer and a poly-silicon layer are formed and stacked on the substrate. Next, a first mask layer is formed on the poly-silicon layer and a second mask layer is formed on the first mask layer. Next, a patterned photoresist is formed on the second mask layer. Next, portions of the second mask layer and portions of the first mask layer are removed to form a hard mask by utilizing the patterned photoresist as an etching mask. Furthermore, the patterned photoresist is removed. Following that, portions of the poly-silicon layer and portions of the metal compound layer are removed to form a gate stack by utilizing the hard mask as an etching mask after removing the patterned photoresist.

Since the patterned photoresist is removed before forming the gate stack, the gate stack is protected from damages of the photoresist-removing process. The photoresist-removing process does not attack the sidewalls of the gate stack, so a bird's beak effect of the gate dielectric layer is prevent.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
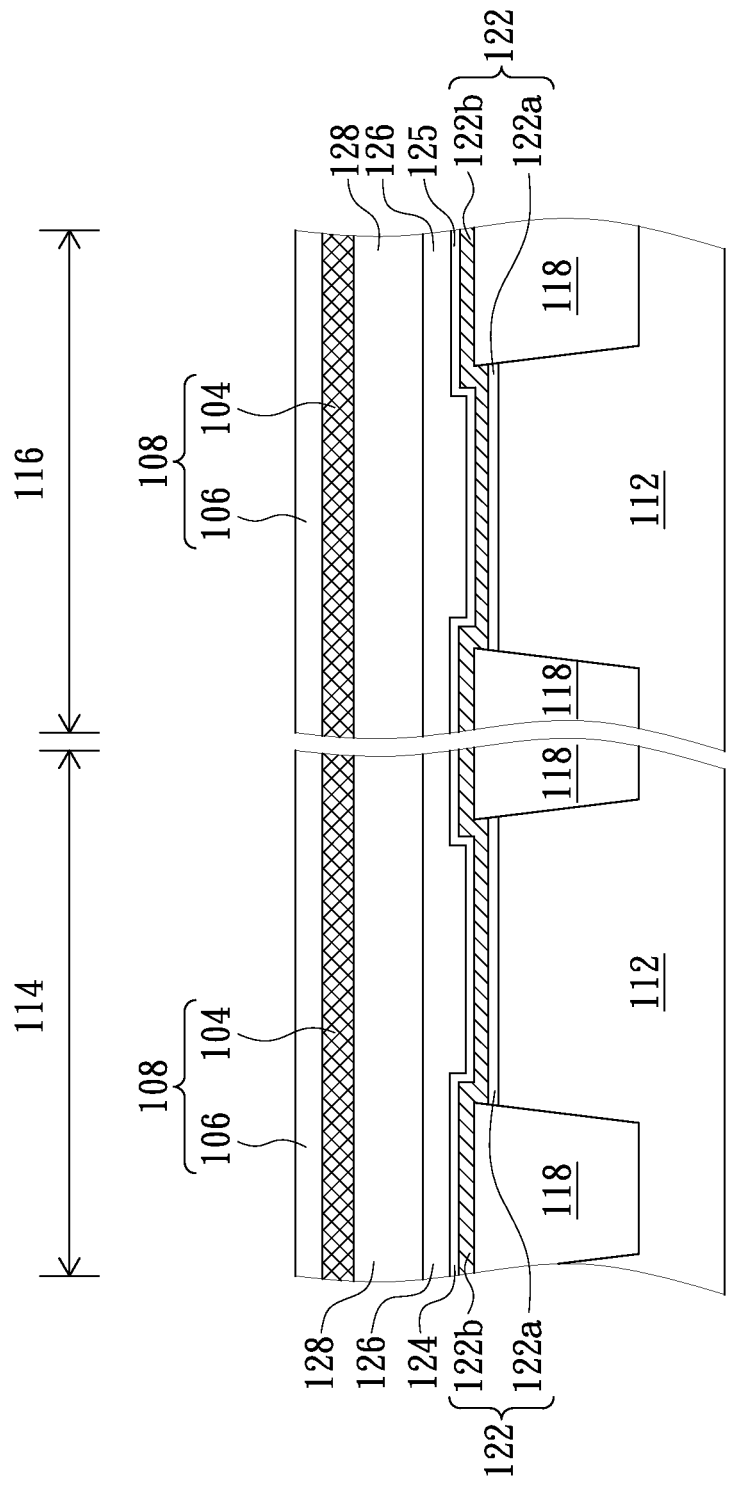
FIGS. 1-8 illustrate a method of forming a metal gate transistor according to a first embodiment of the present invention.

Referring to FIG. 1 through FIG. 8, FIGS. 1-8 illustrate a method of forming a metal gate transistor according to a first embodiment of the present invention, and FIGS. 1-5 can also illustrate a method of forming a metal gate structure. As shown in FIG. 1, a substrate 112, such as a silicon substrate, a silicon-containing substrate, or a silicon-on-insulator (SOI) substrate, is provided. At least one first transistor region 114 and at least one second transistor region 116 are defined in the substrate 112. The first transistor region 114 and the second transistor region 116 may be regions for forming active components, such as NMOS transistors, PMOS transistors, and/or complementary metal oxide semiconductor (CMOS) transistors. In the present embodiment, for example, the first transistor region 114 and the second transistor region 116 are regions for forming an NMOS transistor and a PMOS transistor respectively. A plurality of isolation structures 118, such as field oxide layers or shallow trench isolation (STI) structures, are formed in the substrate 112 in both the first transistor region 114 and the second transistor region 116 by utilizing a local oxidation (LOCOS) process or a shallow trench isolation process. Some of the isolation structures 118 may surround and insulate the active component in the first transistor region 114 and the second transistor region 116.

Thereafter, a gate dielectric layer 122 is formed on the surface of the substrate 112 in both the first transistor region 114 and the second transistor region 116. In this embodiment, the gate dielectric layer 122 may include an oxide layer 122a disposed on the substrate 112, and a high-k material layer 122b disposed on the oxide layer 122a. The oxide layer 122a may be formed by a thermal oxidation process or a chemical vapor deposition (CVD) process, and may include a silicon dioxide layer or a silicon oxynitride layer. Afterwards, the high-k material layer 122b is formed on the oxide layer 122a in both the first transistor region 114 and the second transistor region 116, and may include HfSiO, HfSiON, HfO, LaO, LaAlO, ZrO, ZrSiO, HfZrO, or a combination thereof. In other embodiments, the gate dielectric layer 122 may be a single layer structure or a multiple-layer structure that having material layers more than two, and any proper dielectric material may be included. In addition, an optional cap layer 124 and an optional cap layer 125 may be formed on the gate dielectric layer 122 in the first transistor region 114 and the second transistor region 116 respectively to prevent reactions between the high-k material layer 122b and the following-formed work function metal layer and/or used to adjust the work function of the entirety of gate, and are not limited thereof. In other embodiments, there can be no cap layer on the surface of the gate dielectric layer 122 in the first transistor region 114 and/or the second transistor region 116. In another embodiment, the cap layer 124 on the surface of the gate dielectric layer 122 in the first transistor region 114 is made of the same materials with the cap layer 125 on the surface of the gate dielectric layer 122 in the second transistor region 116.

A process, such as a CVD process, a physical vapor deposition (PVD) process, an atomic layer deposition (ALD) process, a sputtering process or plasma enhanced chemical vapor deposition (PECVD) process, may be performed to form a work function metal layer 126 on the gate dielectric layer 122. Thereafter, a poly-silicon layer 128 and a compound mask layer 108 may be formed in turn on the work function metal layer 126. The work function metal layer 126 may include an N-type work function metal or a P-type work function metal, and the work function metal layer 126 may be a single layer structure or a multiple-layer structure.

Regarding a material selection for the work function metal layer 126, the work function metal layer 126 may include a material with a resistance lower than 100 μ-ohm-cm, such as pure metal, metal alloy, metal oxide, metal nitride, metal oxynitride, metal silicides, metal carbide or other metal compounds. In a case of forming both a NMOS transistor and a PMOS transistor, such as in a case of forming a CMOS transistor, the fermi level of the metal gate preferably approaches to the mid-gap of silicon material. Therefore, the critical voltage (Vth) of the NMOS transistor and the critical voltage of the PMOS transistor may be adjusted to correspond with each other. In addition, the material of the metal gate preferably has great steadiness under high-temperature, good blocking ability from impurities, and great adhesion in the present invention. Thus, the possibility of the material of the gate penetrating into the substrate or the dielectric layer due to pollution may be effectively reduced, and also the possibility of impurities from penetrating into the gate, and peeling effect may be effectively reduced. For example, the work function metal layer 126 may preferably include titanium nitride (TiN), tantalum nitride (TaN), tantalum carbide (TaC) or tungsten nitride (WN). In other embodiments, different work function metal layers may be formed in the first transistor region 114 and the second transistor region 116 for the NMOS transistor and the PMOS transistor respectively. In addition, an ion implanting process or a surface treatment may be performed on the work function metal layer, the process recipes of the work function metal layer may be adjusted, the number of the work function metal may be increase or decrease in the present invention to provide proper work function value or other needed characteristics for different types of transistors.

The compound mask layer 108 may include silicon dioxide ($SiO_2$), silicon nitride (SiN), silicon carbide (SiC), silicon oxynitride (SiON) or the combination thereof. In this embodiment, the step of forming the compound mask layer 108 may preferably include the step of forming a first mask layer 104 on the poly-silicon layer 128; and the step of forming a second mask layer 106 on the first mask layer 104. While an selective epitaxial growth (SEG) process is included in the following procedure, the first mask layer 104 and the second mask layer 106 preferably include a nitride layer and an oxide layer respectively, but not limited thereto. In addition, in order to provide a gate structure having a great profile in the following etching process, the thickness of the compound mask layer 108 may be substantially in a range from 100 angstroms to 1000 angstroms, and the actual thickness be adjusted as require.

Figure 2:
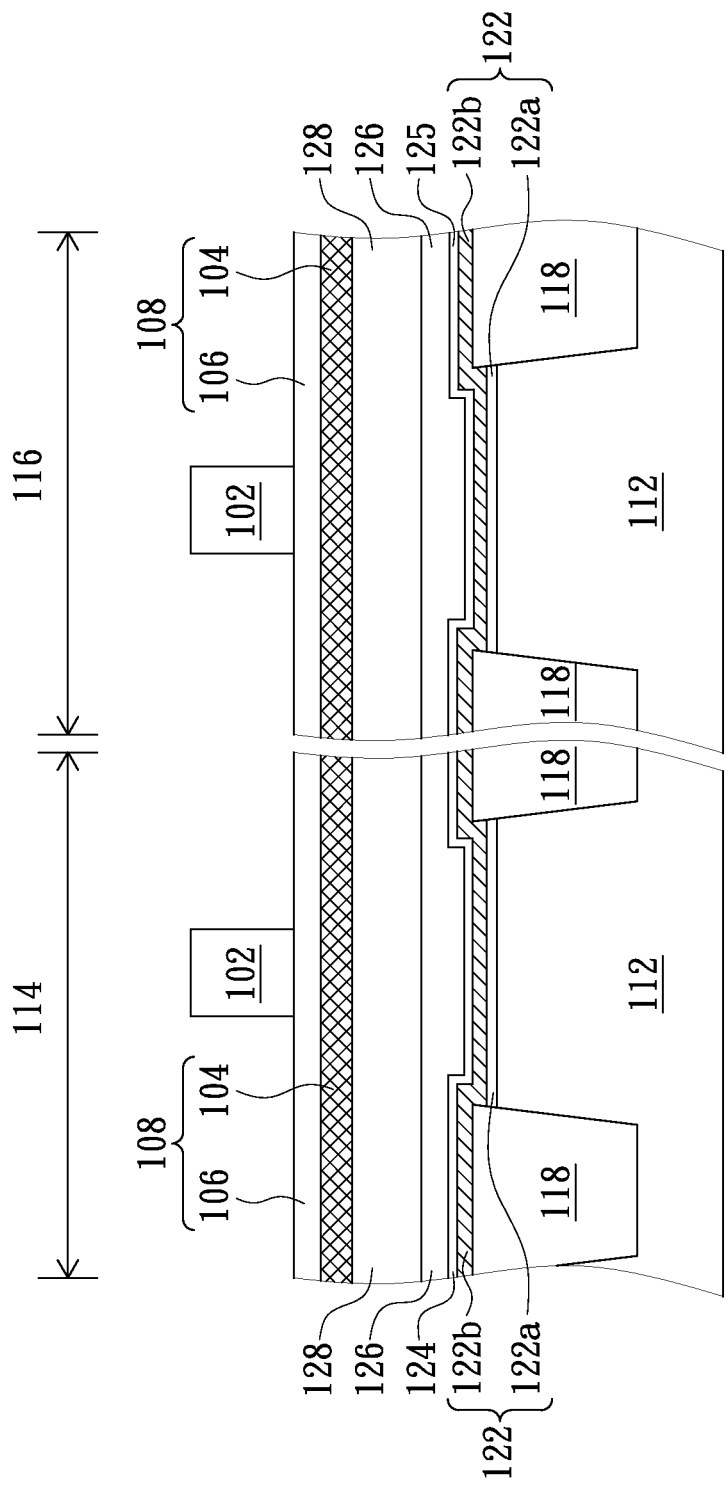

As shown in FIG. 2, a patterned photoresist 102 is formed on the compound mask layer 108. The patterned photoresist 102 can be a single layer or a multi-layer structure. The patterning processes using the multi-layer photoresist can provide a smaller critical dimension for providing a better precision of the semiconductor devices. For example, the patterned photoresist 102 of the present invention can actually include a multi-layer structure consisting of any one of a normal photoresist layer, such as I-line photoresist, a silicon-containing material layer, such as APF, bottom anti-reflection coating (BARC) or top anti-reflection coating (TARC), and a short-wavelength photoresist layer, such as DUV photoresist, and the short-wavelength photoresist layer for example may include the photoresist layer used for 193 nm of wavelength.

Figure 3:
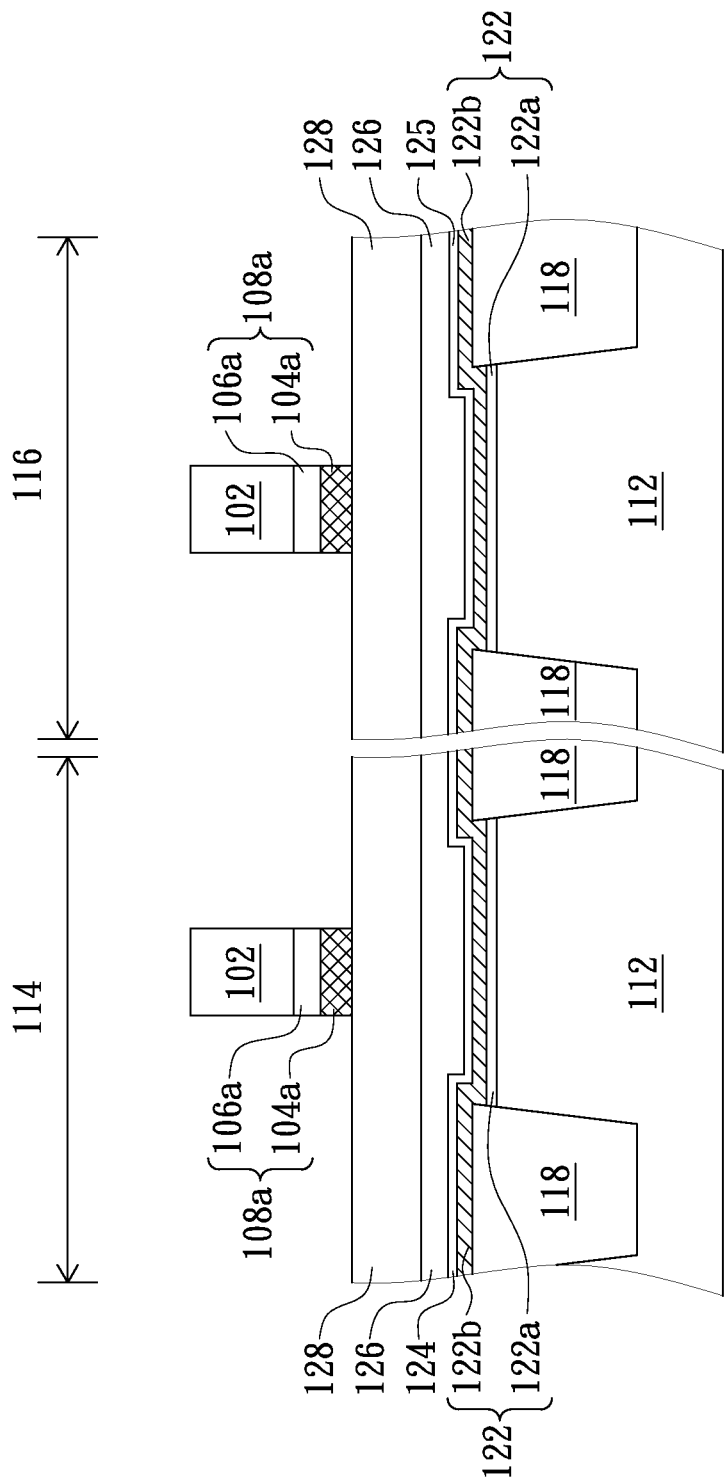

As shown in FIG. 3, one or more etching steps may be carried out on portions of the compound mask layer 108 to remove portions of the second mask layer 106 and portions of the first mask layer 104, so as to form a compound hard mask 108a. The compound hard mask 108a can include the first hard mask 104a and the second hard mask 106a. Next, a trimming process may be optionally performed on the first hard mask 104a to further improve the critical dimension, but not limited thereto. In other embodiments, a trimming process may be performed on the second hard mask 106a, both the first hard mask 104a and the second hard mask 106a, or no trimming process is performed in the present invention.

Figure 4:
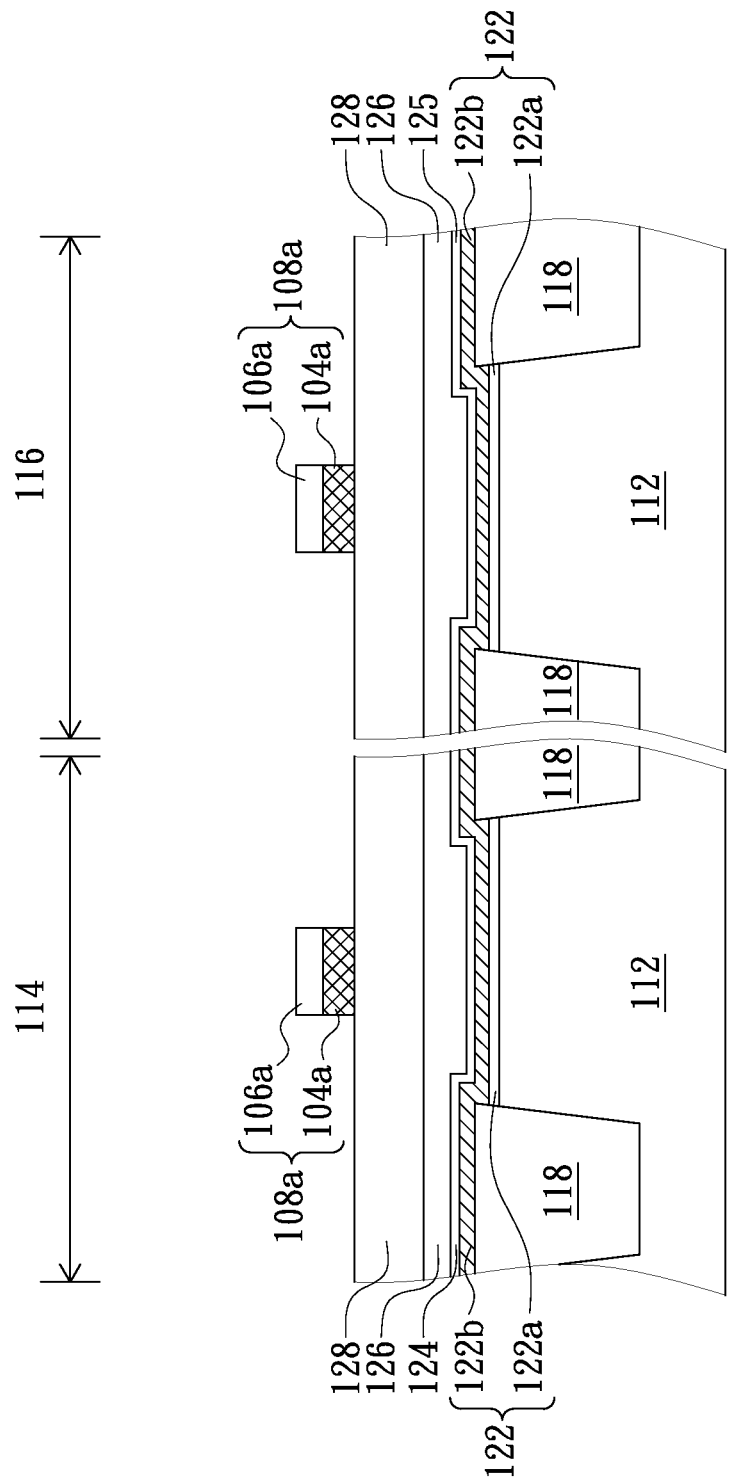

As shown in FIG. 4, the patterned photoresist 102 can next removed after the compound hard mask 108a is performed. For example, an ashing process may be performed to peel off the patterned photoresist 102. Since the gate structure is not formed at this time yet, the process of removing the patterned photoresist 102 does not hurt the follow-up gate stack. Thus, the sidewall of the gate stack is protected, and a bird's beak effect of the gate dielectric layer 122 can be avoided.

Figure 5:
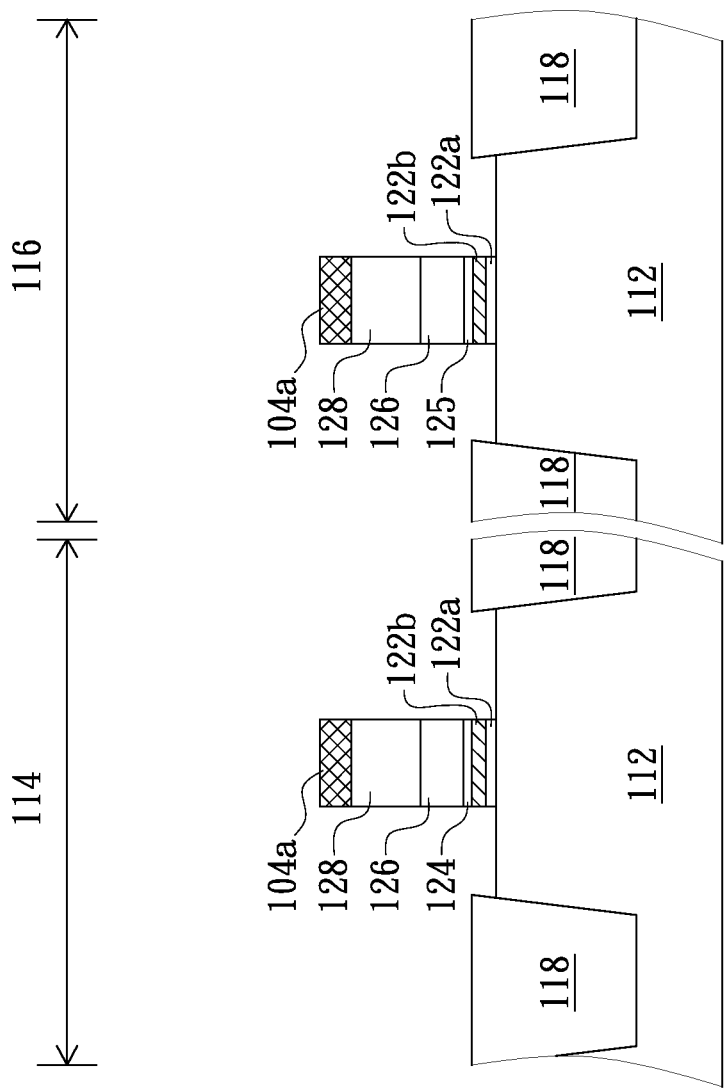

As shown in FIG. 5, one or more etching steps may be carried out on portions of the poly-silicon layer 128, portions of the work function metal layer 126 and portions of the gate dielectric layer 122 to form metal gate stacks in the first transistor region 114 and the second transistor region 116 for the NMOS transistor and the PMOS transistor respectively, and the substrate 112 may be exposed. Take this embodiment as an example, an anisotropic or isotropic dry etching process may be performed on the poly-silicon layer 128 and the work function metal layer 126 by utilizing the compound hard mask 108a as an etching mask to form metal gate stacks of the present invention, and thereafter a wet etching process may be performed by utilizing the compound hard mask 108a as an etching mask to remove portions of the gate dielectric layer 122. In the step of forming the gate stacks, the compound hard mask 108a may be thinned in the above-mentioned dry etching process. For example, the second hard mask 106a may be removed by the above-mentioned dry etching process, while the first hard mask 104a may remain in this embodiment, but not limited thereto. In other embodiments, the step of forming the gate stacks may remove both the first hard mask 104a and the second hard mask 106a, or may leave both the first hard mask 104a and the second hard mask 106a.

Figure 6:
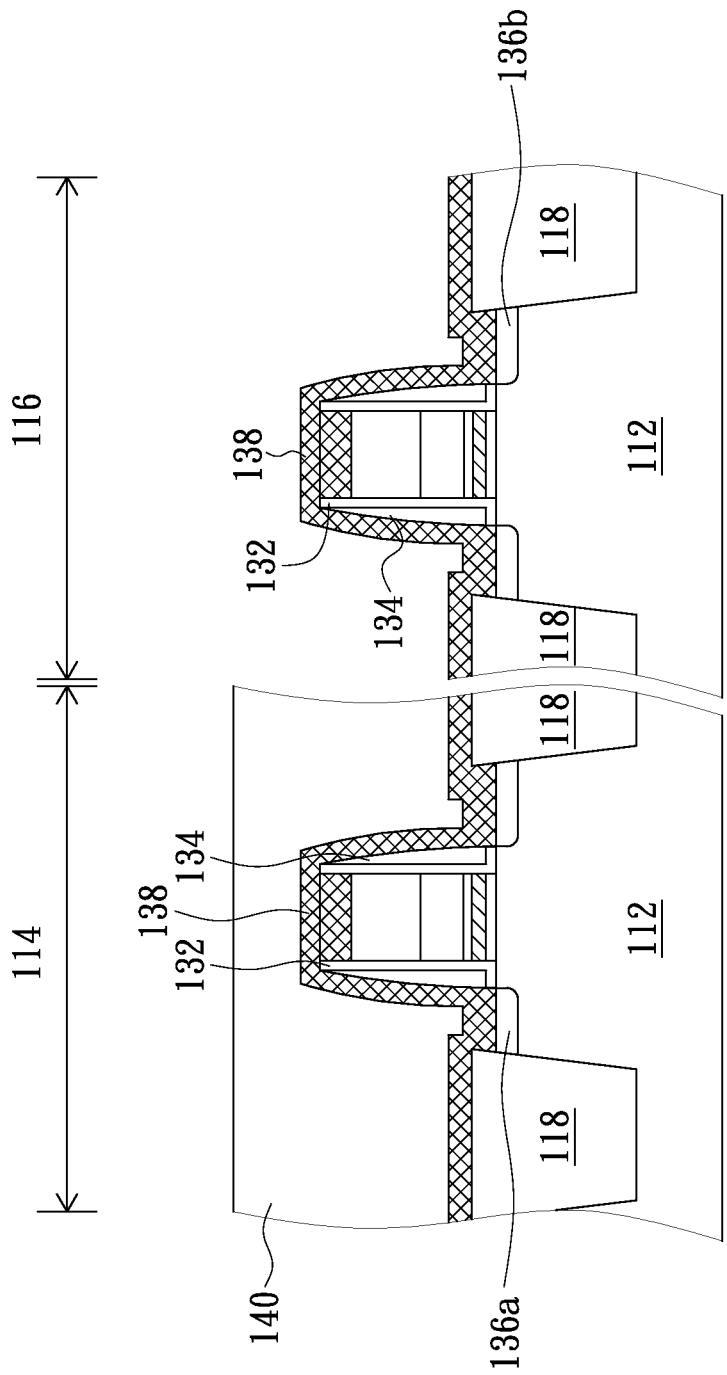

As shown in FIG. 6, offset spacers 132 and spacers 134 may be formed on sidewalls of the metal gate stacks, lightly doping regions 136a and lightly doping regions 136b may optionally be formed in the first transistor region 114 and the second transistor region 116 respectively, and a procedure of defining positions of epitaxial regions may be carried out. The procedure of defining positions of epitaxial regions may include steps of forming a cap layer 138 covering top surfaces of the substrate 112 and the gate stacks overall to define a space between the gate stacks and the follow-up epitaxial regions; and optionally forming another mask layer 140, such as a patterned photoresist, in the first transistor region 114 to protect the first transistor region 114. The cap layer 138 and the first hard mask 104a preferably includes the same or the similar materials, or the cap layer 138 may include any proper materials that can also be removed in the process of removing the first the hard mask 104a. For example, both the cap layer 138 and the first hard mask 104a may include nitrides, but not limited thereto. The thickness of the cap layer 138 may be adjusted as required. For instance, when the thickness of the spacer 134 is about 60 micrometers, and the required space from the gate stack to the epitaxial region is about 120-140 micrometers, the cap layer 138 may have a thickness about 120 micrometers.

Figure 7:
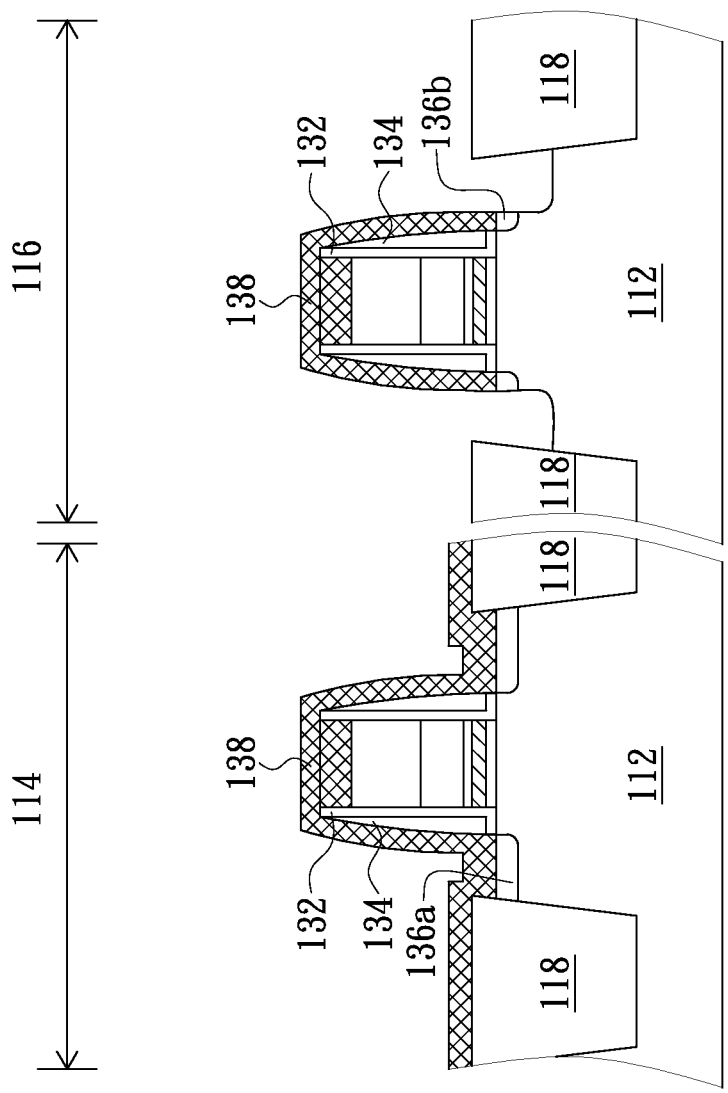

As shown in FIG. 7, an anisotropic etching process may be performed in the second transistor region 116. The anisotropic etching process may first remove portions of the cap layer 138 disposed on the substrate 112 and on the top surface of the gate stacks, so the substrate 112 at two opposite sides of the gate stack may be exposed, and next the anisotropic etching process may further etch the substrate 112 to form two recesses in the substrate 112 at the two opposite sides of the gate stack respectively. In another embodiment, an isotropic etching process can be performed for etching the substrate 112 toward the channel (not shown) after forming the recesses. Following that the mask layer 140 disposed in the first transistor region 114 might be removed.

Figure 8:
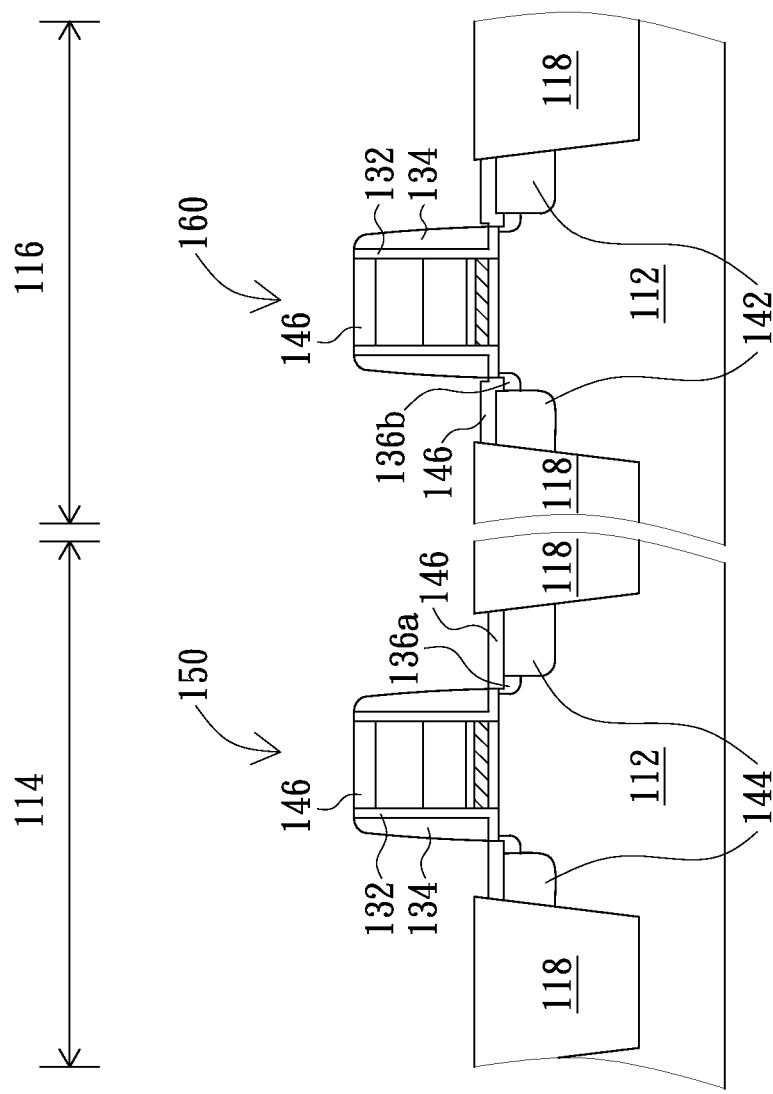

As shown in FIG. 8, an epitaxial growth process may be carried out in the second transistor region 116 to form epitaxial regions in the recesses respectively. The epitaxial region can be applied as the source/drain regions 142 of the second transistor, and for example may include silicon germanium, but not limited thereto. The height of the epitaxial region may be higher than (not shown) or equal to the surface of the substrate 112 and the formation of the epitaxial region may be semi-polygon, such as semi-hexagon (not shown). Afterward, an etching process including a hot phosphoric acid bath may be selectively performed to remove both the remaining cap layer 138 and the first hard mask 104a. Accordingly, the present invention may easily be integrated with the epitaxial growth process, and needs no additional process of removing the compound hard mask 108a. In addition, N-type source/drain regions 144 may be formed in the first transistor region 114 for the NMOS transistor; and a salicide process may be performed to form silicides 146 on the N-type source/drain regions 144, the P-type source/drain regions 142 and selectively on the poly-silicon layer 128. Therefore, a metal gate transistor 150 and a metal gate transistor 160 of the present invention are formed in the first transistor region 114 and the second transistor region 116 respectively. In another embodiment of this invention, both the remaining cap layer 138 and the first hard mask 104a are not removed by hot phosphoric acid solution and the silicides 146 is not formed on the poly-silicon layer 128.

It should be noted that, the above-mentioned step serial numbers are not meant thereto limit the operating sequence, and any rearrangement of the operating sequence for achieving same functionality may be accepted. For example, the source/drain regions 144 may be implanted before the growth of the source/drain regions 142. In other embodiments, another spacer (not shown) can be formed after the growth of the source/drain regions 142, and next the source/drain regions 144 may be formed. The number and the positions of the above-mentioned spacers may be adjusted as required.

Accordingly, since the patterned photoresist is removed before forming the gate stack, the gate stack is protected from damages of the photoresist-removing process. In addition, the remaining nitride cap layer 138 can be easily removed in the follow-up SEG process without additional etching process, so the method of the present invention may benefit by the simple procedure. Adopting of the compound hard mask 108a can improve the gate profile. For forming a gate having a proper profile, performing time period of the gate-etching process should be long enough, and therefore lots of the hard mask may be consumed. In light of this, the hard mask should be thick enough to bear the gate-etching process. However, it is more different to trim a thick hard mask, so the trimming step may take a long time or the critical dimension might be affected. Thus, the present invention may reduce the process time and effectively controls the valve critical dimension due to the compound hard mask 108a.

Figure 9:
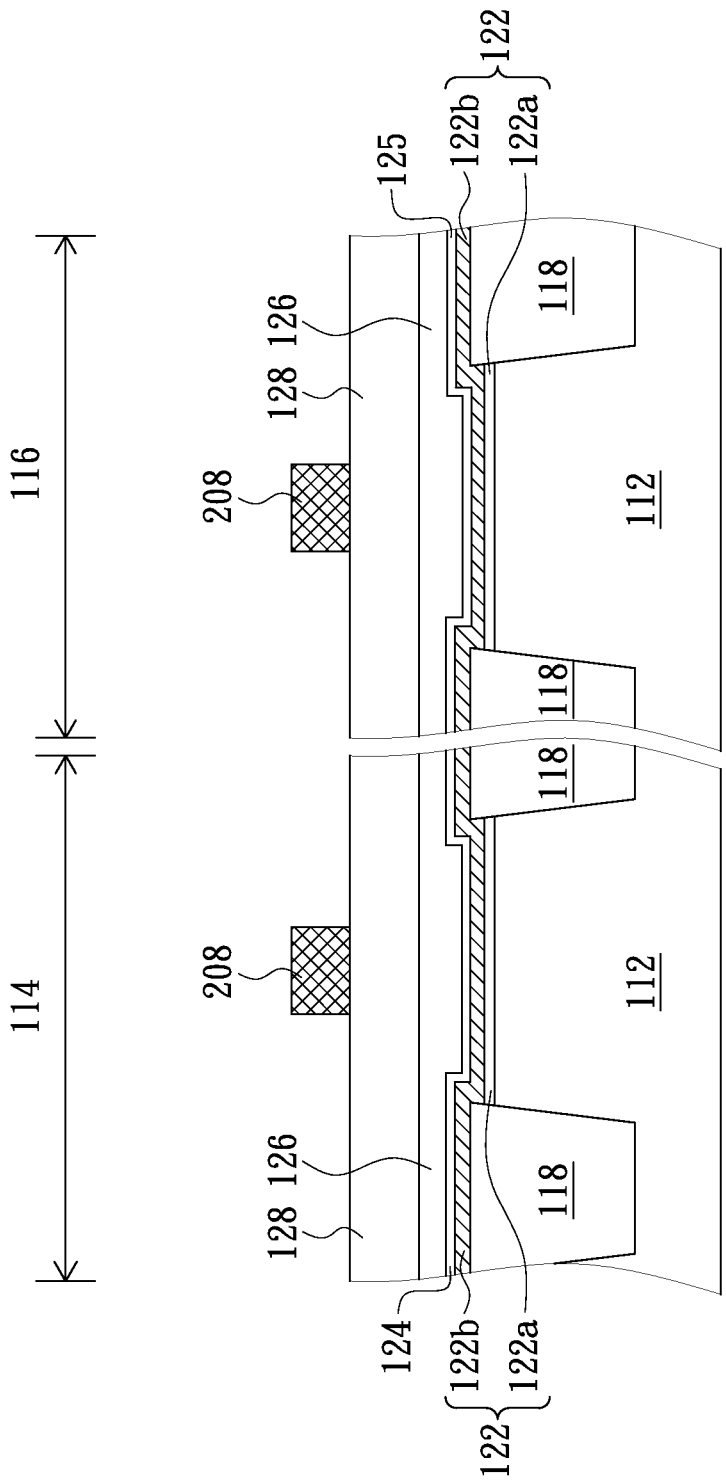
FIG. 9 illustrates a method of forming a metal gate transistor according to a second embodiment of the present invention.

In other embodiments, the above-mentioned first mask layer 104 and second mask layer 106 may have the same material. In other words, the above-mentioned compound hard mask 108a may be replaced by a single-layer structure in the present invention. Please refer to FIG. 9. FIG. 9 illustrates a method of forming a metal gate transistor according to a second embodiment of the present invention. As shown in FIG. 9, the main difference between the second preferred embodiment and the first preferred embodiment is that, the hard mask 208 having a single-layer structure is used in the second preferred embodiment in place of the compound hard mask 108a of the first preferred embodiment, and the hard mask 208 may include nitride. Thus, in the step of forming the gate stacks, the hard mask 208 may be thinned in the dry etching process, and portions of the hard mask 208 still remain. Afterward, both the remaining cap layer 138 and the remaining hard mask 208 may be removed by the hot phosphoric acid bath, but not limited thereto.

Figure 10:
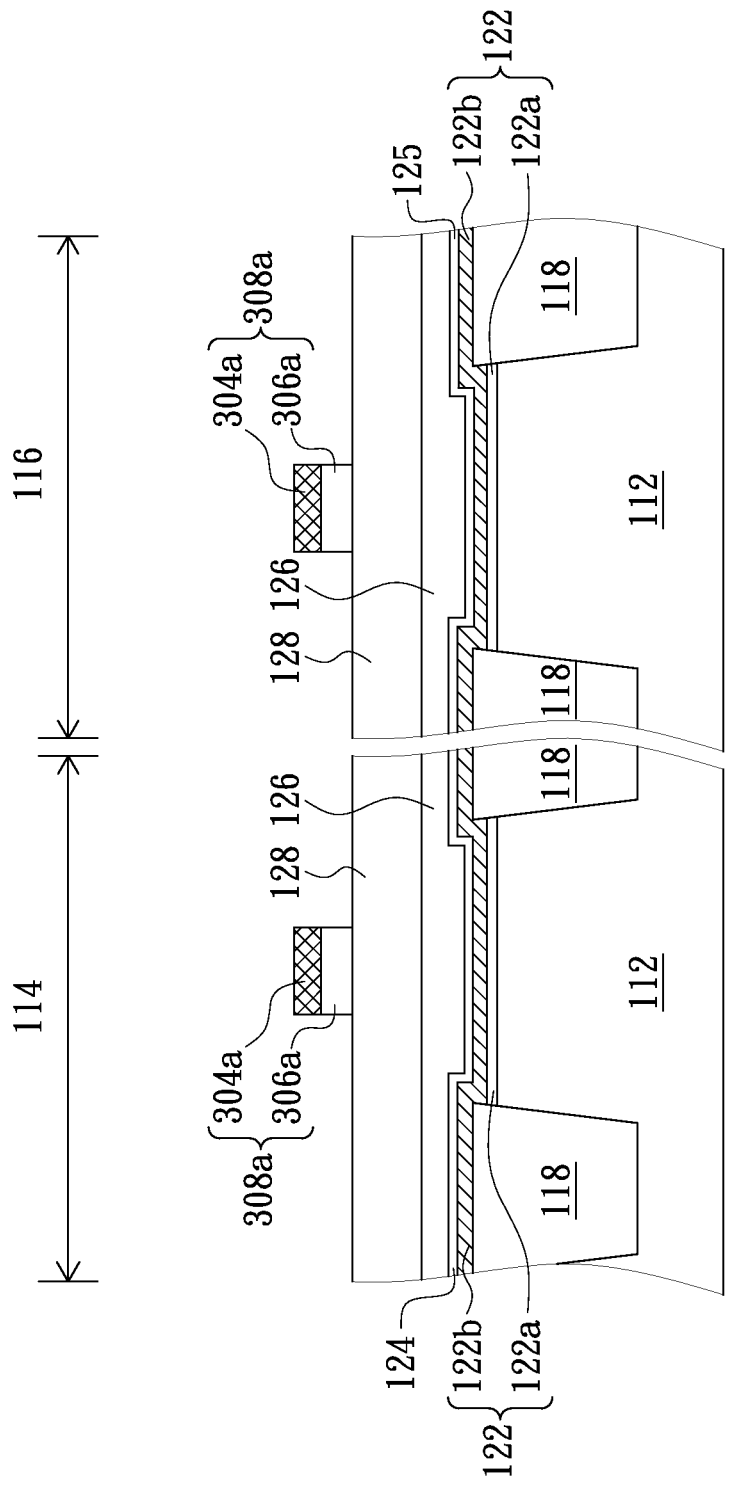
FIGS. 10-12 illustrate a method of forming a metal gate transistor according to a third embodiment of the present invention.
Figure 11:
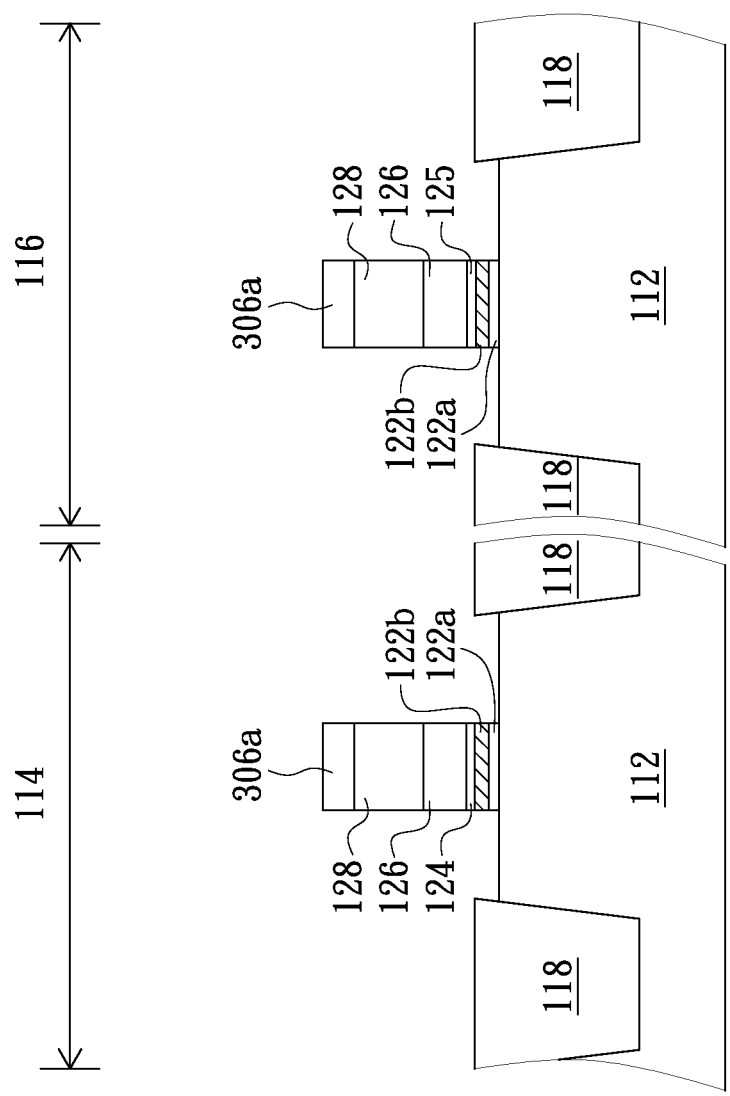
Figure 12:
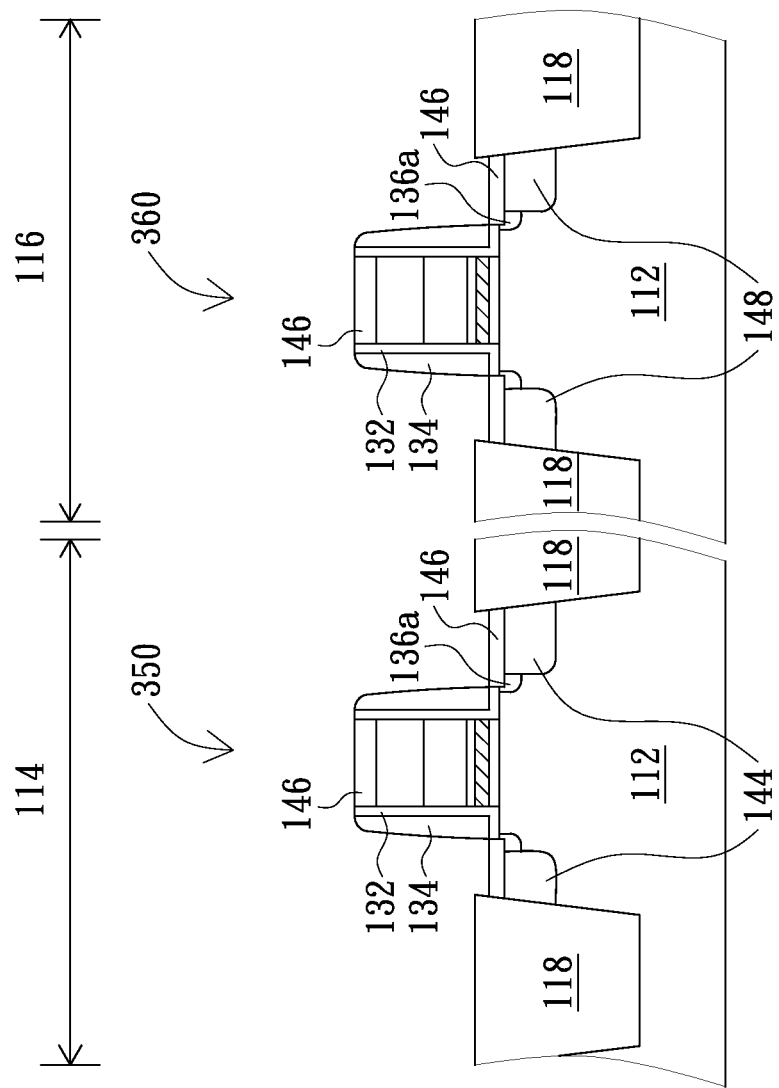

The above-mentioned embodiments all take the metal gate transistor formed by the SEG process as instance, which may be applied to high power devices, but the present invention should not be limited thereto. In other embodiments, the present invention may be integrated with the metal gate transistor without the SEG process, which may be applied to low power devices. Please refer to FIGS. 10-12. FIGS. 10-12 illustrate a method of forming a metal gate transistor according to a third embodiment of the present invention. As shown in FIG. 10, the main difference between the third preferred embodiment and the first preferred embodiment is that, the compound hard mask 308a includes the first hard mask 306a and the second hard mask 304a, and the first hard mask 306a and the second hard mask 304a may preferably include an oxide layer and a nitride layer respectively in the third preferred embodiment.

As shown in FIG. 11, the second hard mask 304a may be removed by the above-mentioned dry etching process in the step of forming the gate stacks, while the first hard mask 306a may remain in this embodiment, but not limited thereto.

As shown in FIG. 12, the first hard mask 306a having oxide may be removed by a dilute hydrofluoric acid solution; offset spacers 132 and spacers 134 may be formed on sidewalls of the metal gate stacks; lightly doping regions 136a and lightly doping regions 136b may optionally be formed in the first transistor region 114 and the second transistor region 116 respectively; source/drain regions 144 and source/drain regions 148 may optionally be formed in the first transistor region 114 and the second transistor region 116 respectively; and a salicide process may be performed to form silicides 146 on the N-type source/drain regions 144, the P-type source/drain regions 148 and selectively on the poly-silicon layer 128. Therefore, a metal gate transistor 350 and a metal gate transistor 360 of the present invention are formed in the first transistor region 114 and the second transistor region 116 respectively. It should be noted that, the above-mentioned step serial numbers are not meant thereto limit the operating sequence, and any rearrangement of the operating sequence for achieving same functionality may be accepted.

In other embodiments, the first hard mask 306a and the second hard mask 304a may both include oxide, and form a single-layer structure as the hard mask 208 shown in FIG. 9. Thus, the remaining hard mask 208 may also be removed by a dilute hydrofluoric acid solution, but not limited thereto. In such a case, the transistors may be applied to low power devices.

Figure 13:
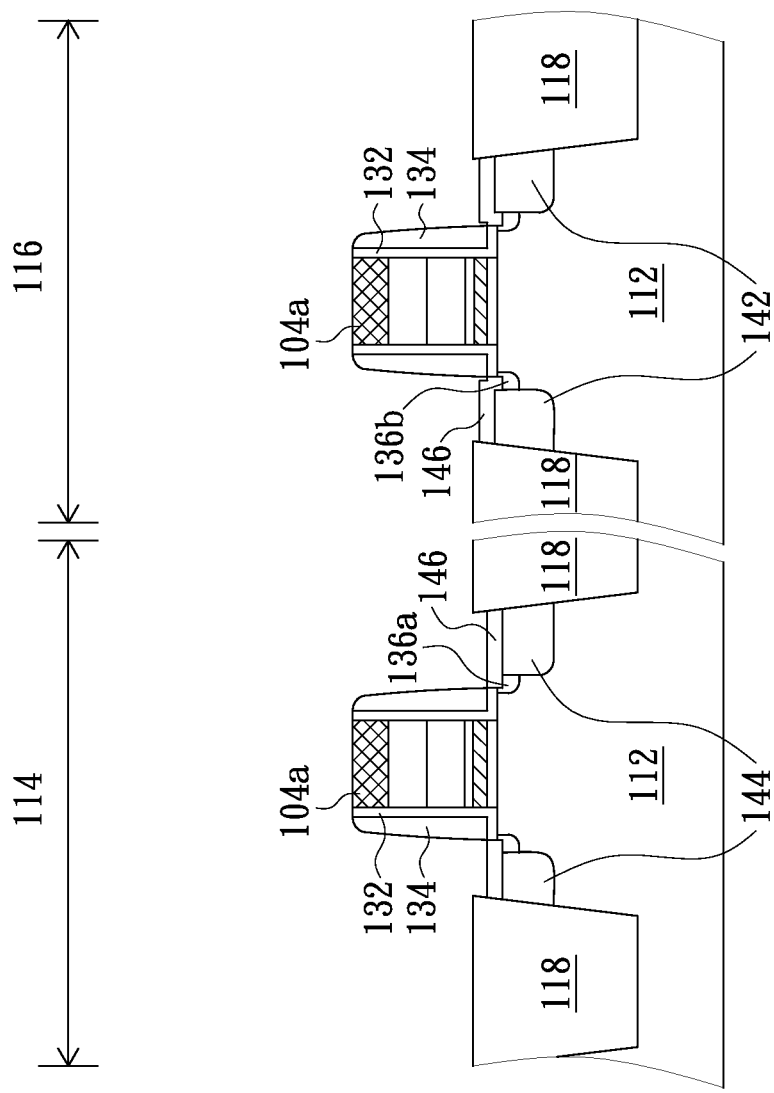
FIGS. 13-16 illustrate a method of forming a metal gate transistor according to a fourth embodiment of the present invention.

It is needed to know that the above embodiments are illustrated taking gate-first methods as an example. However, as known by any one of ordinary skill in the art, the present invention can also be applied into gat-last methods and structures. In another embodiment of this invention, as shown in FIG. 13, before performing the salicide process, the cap layer 138 shown in FIG. 7 may be removed firstly and the first hard mask 104a is remained. Then the salicide process is performed to form silicides 146 on the N-type source/drain regions 144 and the P-type source/drain regions 142.

Figure 14:
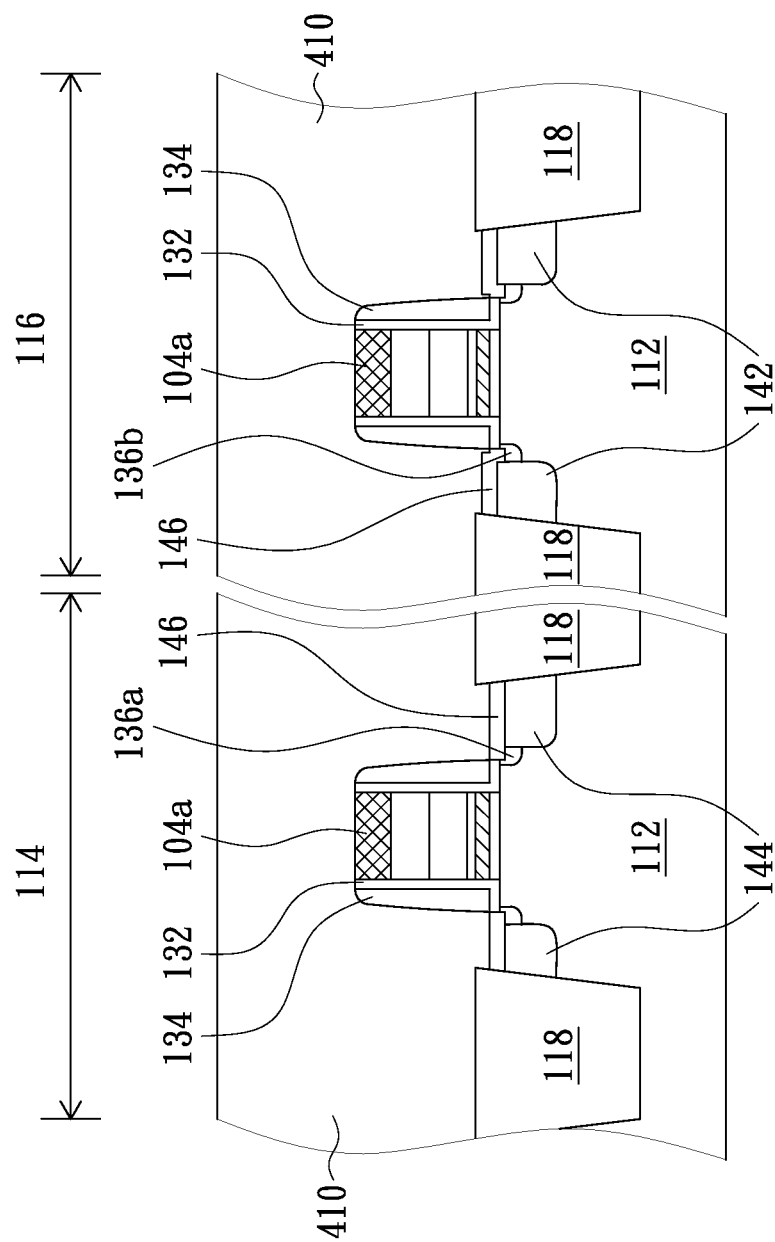
Figure 15:
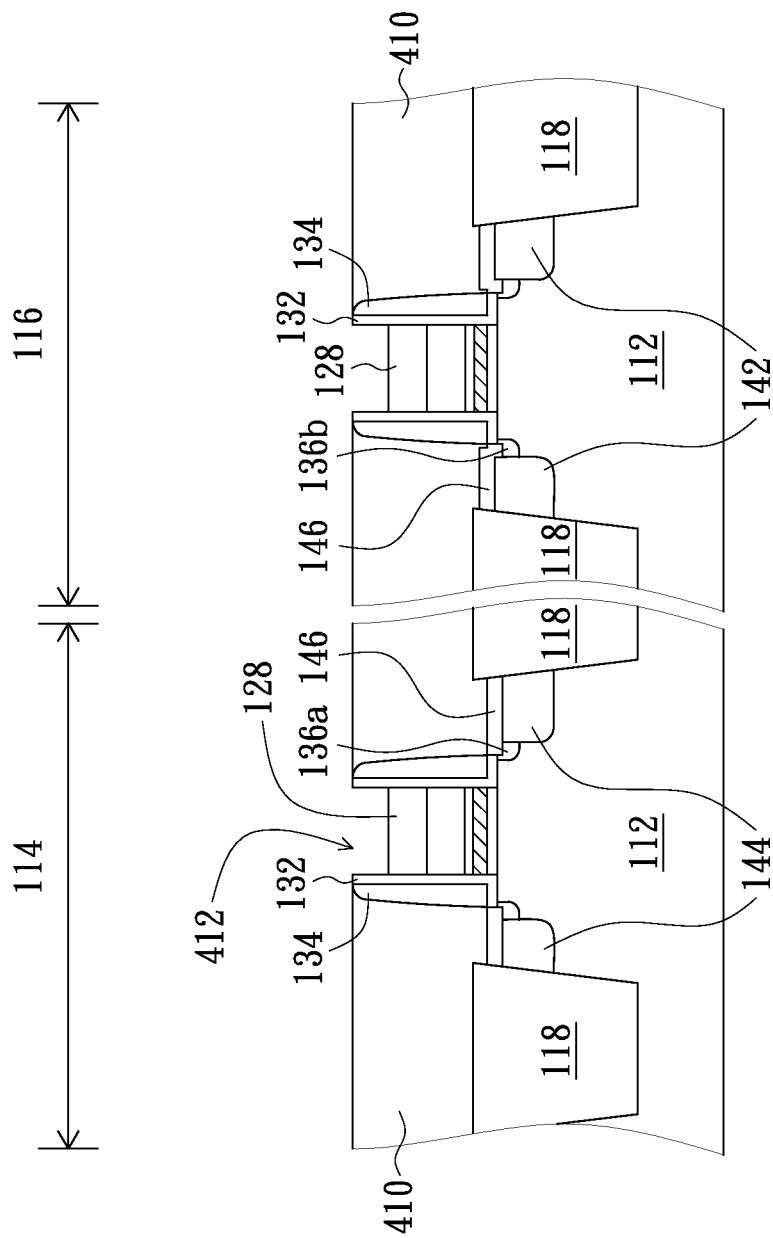
Figure 16:
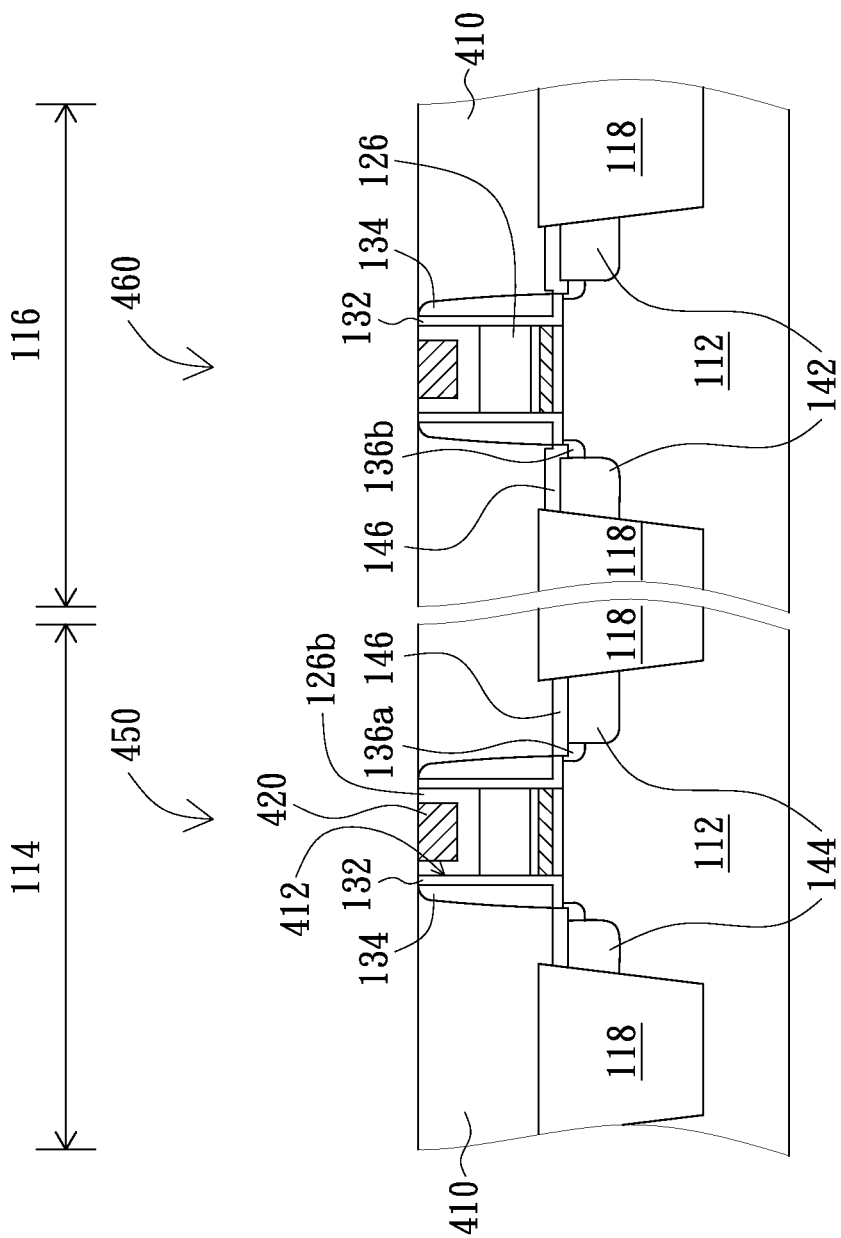

As shown in FIG. 14 and FIG. 15, a dielectric layer 410 is formed on the substrate 112. Then, the dielectric layer 410 is planarized and the first hard mask 104a is removed simultaneously. Accordingly, the poly-silicon layer 128 of the gate structure is exposed. As shown in FIG. 16, the poly-silicon layer 128 is removed so that an opening 412 exposing the work function metal layer 126. Following that, a work function metal layer 126b is filled into the opening 412 and covering the sidewalls of the opening 412 and the work function metal layer 126. Specifically, a conformal metal-containing material (not shown) is formed on the dielectric layer 410 and then the portions of the metal-containing material outside of the opening 412 are removed to form the work function metal layer 126b. Then, a conductive layer 420 is filled onto the work function metal layer 126b thereby obtaining a gate-last type metal gate transistor 450 and 460. It should be noted that the materials of the work function metal layer 126b formed in the PMOS transistor are different from that of the work function metal layer 126b formed in the NMOS transistor, and the forming process of those are different.

In summary, since the patterned photoresist is removed before forming the gate stack, the gate stack is protected from damages of the photoresist-removing process. The photoresist-removing process does not attack the sidewalls of the gate stack, so a bird's beak effect of the gate dielectric layer is prevent, and the formed transistors can have improved electrode characteristics. Furthermore, the present invention can easily remove the remaining hard mask without additional etching process, no mater the hard mask includes a nitride mask or an oxide mask disposed on the surface of the poly-silicon layer, so the method of the present invention may benefit by the simple procedure. Moreover, the present invention may reduce the process time and effectively controls the valve critical dimension due to the compound hard mask.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of forming metal gate structure, comprising:
providing a substrate;
forming a gate dielectric layer, a material layer and a poly-silicon layer stacked on the substrate;
forming a first mask layer on the poly-silicon layer;
forming a second mask layer on the first mask layer;
forming a patterned photoresist on the second mask layer;
removing portions of the second mask layer and portions of the first mask layer to form a hard mask including a first hard mask and a second hard mask by utilizing the patterned photoresist as an etching mask;
removing the patterned photoresist;
removing portions of the poly-silicon layer and portions of the material layer to form a gate stack by utilizing the hard mask as an etching mask after removing the patterned photoresist while the first hard mask of the hard mask being remained;
forming two source/drain regions in the substrate at the two opposite sides of the gate stack respectively; and
performing an etching process to remove the first hard mask of the hard mask after the two source/drain regions is formed.

2. The method of claim 1, wherein a resistance of the material layer is lower than 100 μ-ohm-cm.

3. The method of claim 1, wherein the material layer is either a single layer structure or a multiple-layer structure.

4. The method of claim 1, wherein the material layer comprises titanium nitride (TiN).

5. The method of claim 1, wherein the material layer is a multiple-layer structure comprised of a titanium nitride layer and a tantalum nitride layer.

6. The method of claim 1, wherein the hard mask is an oxide mask or a nitride mask.

7. The method of claim 1, wherein the first mask layer and the second mask layer consist of different materials.

8. The method of claim 1, wherein the first mask layer comprises a nitride layer, and the second mask layer comprises an oxide layer.

9. The method of claim 1, wherein the first mask layer comprises an oxide layer, and the second mask layer comprises a nitride layer.

10. The method of claim 1, further comprising:
    removing portions of the gate dielectric layer by utilizing the hard mask as an etching mask after forming the gate stack.

11. The method of claim 1, wherein removing portions of the poly-silicon layer and portions of the material layer to form the gate stack after removing the patterned photoresist is configured for protecting a sidewall of the gate stack from hurt so that a bird's beak effect of the gate dielectric layer is prevent.

12. A method of forming metal gate structure, comprising:
    providing a substrate;
    forming a gate dielectric layer, a metal compound layer and a poly-silicon layer stacked on the substrate;
    forming a first mask layer on the poly-silicon layer;
    forming a second mask layer on the first mask layer;
    forming a patterned photoresist on the second mask layer;
    removing portions of the second mask layer and portions of the first mask layer to form a hard mask including a first hard mask and a second hard mask by utilizing the patterned photoresist as an etching mask;
    removing the patterned photoresist;
    removing portions of the poly-silicon layer and portions of the metal compound layer to form a gate stack by utilizing the hard mask as an etching mask after removing the patterned photoresist while the first hard mask of the hard mask being remained;
    forming two source/drain regions in the substrate at the two opposite sides of the gate stack respectively; and
    performing an etching process to remove the first hard mask of the hard mask after the two source/drain regions is formed.

13. The method of claim 12, wherein a resistance of the metal compound layer is lower than 100 μ-ohm-cm.

14. The method of claim 12, wherein the metal compound layer is a single layer structure or a multiple-layer structure.

15. The method of claim 12, wherein the metal compound layer comprises titanium nitride (TiN).

16. The method of claim 12, wherein the metal compound layer is a multiple-layer structure comprised of a titanium nitride layer and a tantalum nitride layer.

17. The method of claim 1, wherein the step of forming the source/drain regions comprises:
    forming a cap layer to cover the substrate and the gate stacks overall;
    performing an anisotropic etching process to remove portions of the cap layer and to form two recesses in the substrate at the two opposite sides of the gate stack respectively and to leave a remained cap layer; and
    performing an epitaxial growth process to form the two source/drain regions in the two recesses;
    wherein the remained cap layer is removed by the etching process together with the first hard mask.

18. The method of claim 12, wherein the step of forming the source/drain regions comprises:
    forming a cap layer to cover the substrate and the gate stacks overall;
    performing an anisotropic etching process to remove portions of the cap layer and to form two recesses in the substrate at the two opposite sides of the gate stack respectively and to leave a remained cap layer; and
    performing an epitaxial growth process to form the two source/drain regions in the two recesses;
    wherein the remained cap layer is removed by the etching process together with the first hard mask.

* * * * *